US011594801B2

(12) United States Patent
Dogiamis et al.

(10) Patent No.: US 11,594,801 B2
(45) Date of Patent: Feb. 28, 2023

(54) MMWAVE DIELECTRIC WAVEGUIDE INTERCONNECT TOPOLOGY FOR AUTOMOTIVE APPLICATIONS

(71) Applicant: Intel Corporation, Santa Clara, CA (US)

(72) Inventors: Georgios Dogiamis, Chandler, AZ (US); Sasha Oster, Marion, IA (US); Telesphor Kamgaing, Chandler, AZ (US); Erich Ewy, Phoenix, AZ (US); Kenneth Shoemaker, Los Altos Hills, CA (US); Adel Elsherbini, Chandler, AZ (US); Johanna Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 122 days.

(21) Appl. No.: 16/613,070

(22) PCT Filed: Jul. 1, 2017

(86) PCT No.: PCT/US2017/040553
§ 371 (c)(1),
(2) Date: Nov. 12, 2019

(87) PCT Pub. No.: WO2019/009874
PCT Pub. Date: Jan. 10, 2019

(65) Prior Publication Data
US 2020/0168972 A1    May 28, 2020

(51) Int. Cl.
*B60R 11/04*    (2006.01)
*H01P 3/16*    (2006.01)
(Continued)

(52) U.S. Cl.
CPC ............. *H01P 3/165* (2013.01); *B60R 11/04* (2013.01); *B60R 16/0231* (2013.01);
(Continued)

(58) Field of Classification Search
CPC . H01P 3/165; H01P 3/16; B60R 11/04; B60R 16/0231; B60W 40/02;
(Continued)

(56) References Cited

U.S. PATENT DOCUMENTS 11,251,512 B2 *    2/2022    Dogiamis ................. H01P 5/08
2010/0026368 A1 *    2/2010    Tang ................. H01L 23/49534
327/361
(Continued)

FOREIGN PATENT DOCUMENTS

TW    201607807    1/2016
WO    WO-2017-052656    3/2017

OTHER PUBLICATIONS

International Preliminary Report on Patentability for International Patent Application No. PCT/US2017/040553, dated Jan. 16, 2020, 13 pages.

(Continued)

*Primary Examiner* — Richard Tan
(74) *Attorney, Agent, or Firm* — Schwabe, Williamson & Wyatt, P.C.

(57) ABSTRACT

Embodiments of the invention include autonomous vehicles and mm-wave systems for communication between components. In an embodiment the vehicle includes an electronic control unit (ECU). The ECU may include a printed circuit board (PCB) and a CPU die packaged on a CPU packaging substrate. In an embodiment, the CPU packaging substrate is electrically coupled to the PCB. The ECU may also include an external predefined interface electrically coupled to the CPU die. In an embodiment, an active mm-wave intercon- (Continued)

nect may include a dielectric waveguide, and a first connector coupled to a first end of the dielectric waveguide. In an embodiment, the first connector comprises a first mm-wave engine, and the first connector is electrically coupled to the external predefined interface. Embodiments may also include a second connector coupled to a second end of the dielectric waveguide, wherein the second connector comprises a second mm-wave engine.

20 Claims, 11 Drawing Sheets

(51) Int. Cl.
*B60R 16/023* (2006.01)
*B60W 40/02* (2006.01)

(52) U.S. Cl.
CPC ......... *B60W 40/02* (2013.01); *B60W 2420/42* (2013.01); *B60W 2420/52* (2013.01); *B60W 2420/54* (2013.01)

(58) Field of Classification Search
CPC ......... B60W 2420/42; B60W 2420/52; B60W 2420/54; H01L 2223/6627; H01L 2924/1432; H01L 2924/15311; H01L 2924/143; H01L 23/66
USPC ....................................... 307/10.1
See application file for complete search history.

(56) References Cited

U.S. PATENT DOCUMENTS

| | | |
|---|---|---|
| 2013/0158800 A1 | 6/2013 | Trageser |
| 2013/0307645 A1 | 11/2013 | Mita et al. |
| 2014/0273552 A1* | 9/2014 | Ganesan ............... H05K 3/363 |
| | | 439/65 |
| 2014/0303807 A1 | 10/2014 | Addepalli et al. |
| 2015/0166059 A1 | 6/2015 | Ko |
| 2015/0185425 A1* | 7/2015 | Gundel .................... G02B 6/43 |
| | | 455/90.2 |
| 2015/0295297 A1* | 10/2015 | Cook .................... H01P 11/001 |
| | | 333/239 |
| 2015/0295300 A1* | 10/2015 | Herbsommer ........ H01P 1/2002 |
| | | 333/208 |
| 2016/0240907 A1* | 8/2016 | Haroun ................ H01Q 1/3233 |
| 2017/0354048 A1* | 12/2017 | Harshbarger ............ F01N 3/103 |
| 2018/0183561 A1* | 6/2018 | Dogiamis .......... H04W 72/0453 |
| 2018/0217955 A1* | 8/2018 | Ito ....................... G06F 13/4086 |
| 2019/0182415 A1* | 6/2019 | Sivan ..................... G06F 3/013 |
| 2019/0348737 A1* | 11/2019 | Dogiamis ............... G06F 15/16 |

OTHER PUBLICATIONS

International Search Report and Written Opinion for International Patent Application No. PCT/US2017/040553 dated Mar. 29, 2018, 14 pgs.
Office Action from Taiwan Patent Application No. 107116982, dated Sep. 16, 2021, 23 pages.
Office Action from Taiwan Patent Application No. 107116982, dated Jan. 19, 2022, 3 pages.

\* cited by examiner

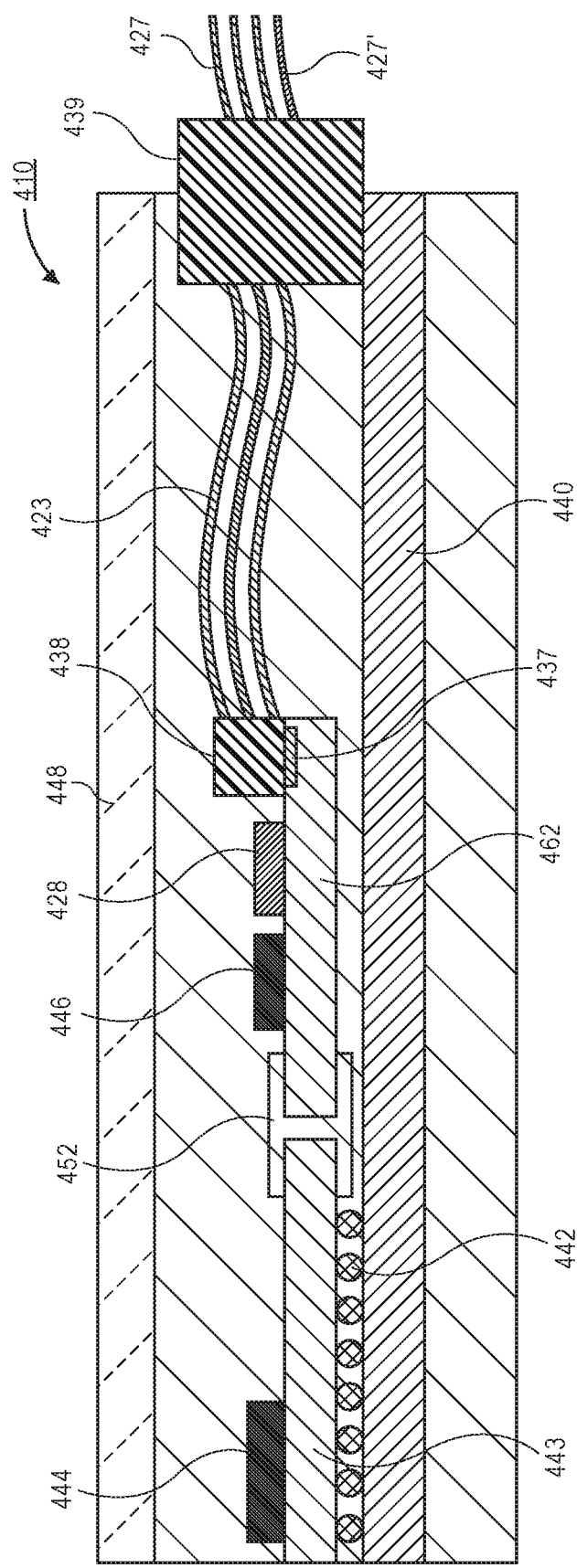
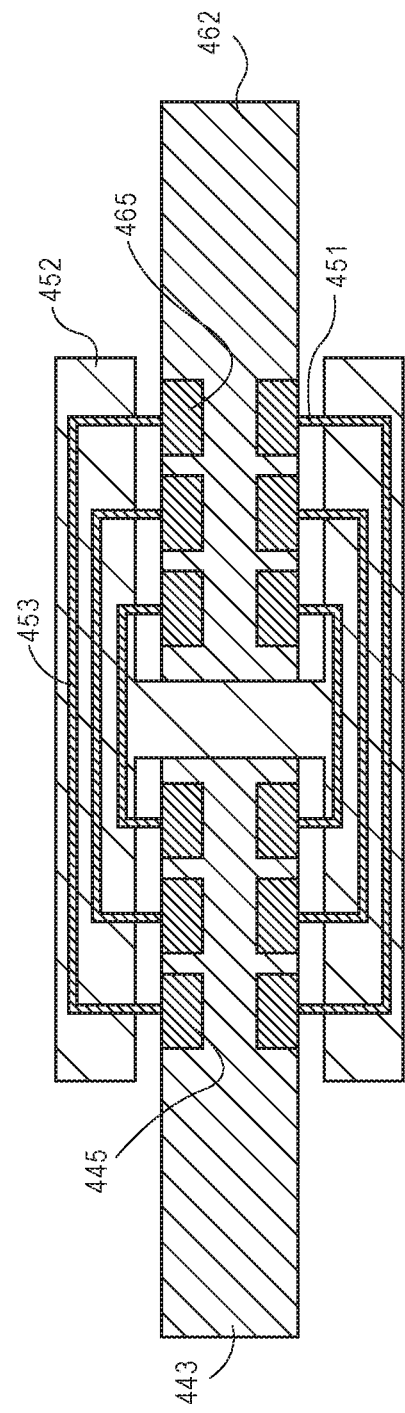
FIG. 4A
FIG. 4B

MMWAVE DIELECTRIC WAVEGUIDE INTERCONNECT TOPOLOGY FOR AUTOMOTIVE APPLICATIONS

CROSS-REFERENCE TO RELATED APPLICATION

This patent application is a U.S. National Phase Application under 35 U.S.C. § 371 of International Application No. PCT/US2017/040553, filed Jul. 1, 2017, entitled "MMWAVE DIELECTRIC WAVEGUIDE INTERCONNECT TOPOLOGY FOR AUTOMOTIVE APPLICATIONS," which designates the United States of America, the entire disclosure of which is hereby incorporated by reference in its entirety and for all purposes.

FIELD OF THE INVENTION

Embodiments of the invention are in the field of semiconductor packaging and, in particular, formation of pluggable mm-wave interconnects for use in automotive applications.

BACKGROUND OF THE INVENTION

The automotive industry is rapidly progressing towards the production of autonomous and/or self-driving vehicles. Autonomous vehicles utilize many sensors that generate data regarding the position of the vehicle relative to surrounding objects, such as the road, other cars, traffic signals, lane markings, pedestrians, and the like. As illustrated in FIG. 1, a vehicle 100 may include any number of sensors 102, video cameras 103, and positioning systems 104, such as global positioning systems (GPS). For example, sensors 102 may include video sensors, image sensors, ultrasonic sensors, radar sensors, light detection and ranging (LIDAR) sensors, or the like. The data generated from these components needs to be processed in order to determine how the vehicle needs to react. As such, the generated data is transferred from the peripheral components to an electronic control unit (ECU) 105 over one or more interconnects. Accordingly, the additional peripheral sensors and other components needed for autonomous and/or self-driving vehicle results in a significant increase in the amount of data that is transferred within the vehicle.

Currently, autonomous vehicles that are being tested utilize data-transfers at rates between approximately 1.0 Gbps and 1.5 Gbps and employ four different low-voltage differential signaling (LVDS) lanes to allow for a total data rate between approximately 4.0 Gbps and 6.0 Gbps. However, the data rate needed in the subsequent generations of autonomous vehicles is expected to increase to approximately 10 Gbps or more (i.e., approximately 2.5 Gbps using four differential LVDS lanes). This increase in the data rate far exceeds the data rate of existing systems in currently available vehicles. For example, the standard for multimedia and infotainment networking in vehicles i.e., media oriented systems transport bus (MOST) has a data transfer rate of 150 Mbps.

Some solutions for providing high-speed interconnects include electrical interconnects and optical interconnects. However, both suffer significant drawbacks when used in the automotive industry. Electrical connections, such as ethernet, may be utilized by employing multiple lanes (i.e., cables) to reach the required bandwidth. However, this becomes increasingly expensive and power hungry to support the required data rates for short to intermediate (e.g., 5 m-10 m) interconnects needed in the automotive industry. For example, to extend the length of a cable or the given bandwidth on a cable, higher quality cables may need to be used or advanced equalization, modulation, and/or data correction techniques employed. Unfortunately, these solutions require additional power and increase the latency of the system. Latency increases are particularly problematic in autonomous vehicles due to the need to make rapid decisions (e.g., braking, avoidance maneuvers, drive train corrections, etc.) needed to ensure the safety of passengers within the vehicle and/or persons and/or property external to the vehicle.

Optical transmission over fiber is capable of supporting the required data rates and distances needed for autonomous and/or self-driving vehicles. However, the use of optical connections results in a severe power and cost penalty, especially for short to medium distances (e.g., 5 m-10 m) because of the need for conversion between optical and electrical signals. Furthermore, the alignment of optical interconnects needs to be precisely maintained. This proves to be difficult in automotive applications due to vibrations and other environmental conditions that may alter the alignment of the optical interconnects, and therefore, reduces the reliability of optical interconnects.

Accordingly, both technologies (traditional electrical and optical) are not optimal for autonomous and/or self-driving vehicles that require high data-rate, low latency, and low power interconnect lines between peripheral sensors and the ECU.

BRIEF DESCRIPTION OF THE DRAWINGS

FIG. 4A is a cross-sectional illustration of an ECU that includes an active mm-wave interconnect attached inside the ECU where the predefined digital interconnect interface is mounted on the package of the active mm-wave interconnect, according to an embodiment of the invention.

FIG. 4B is a cross-sectional illustration of the connector that connects the CPU package substrate to the active mm-wave package substrate, according to an embodiment of the invention.

DETAILED DESCRIPTION OF THE INVENTION

Figure 1:
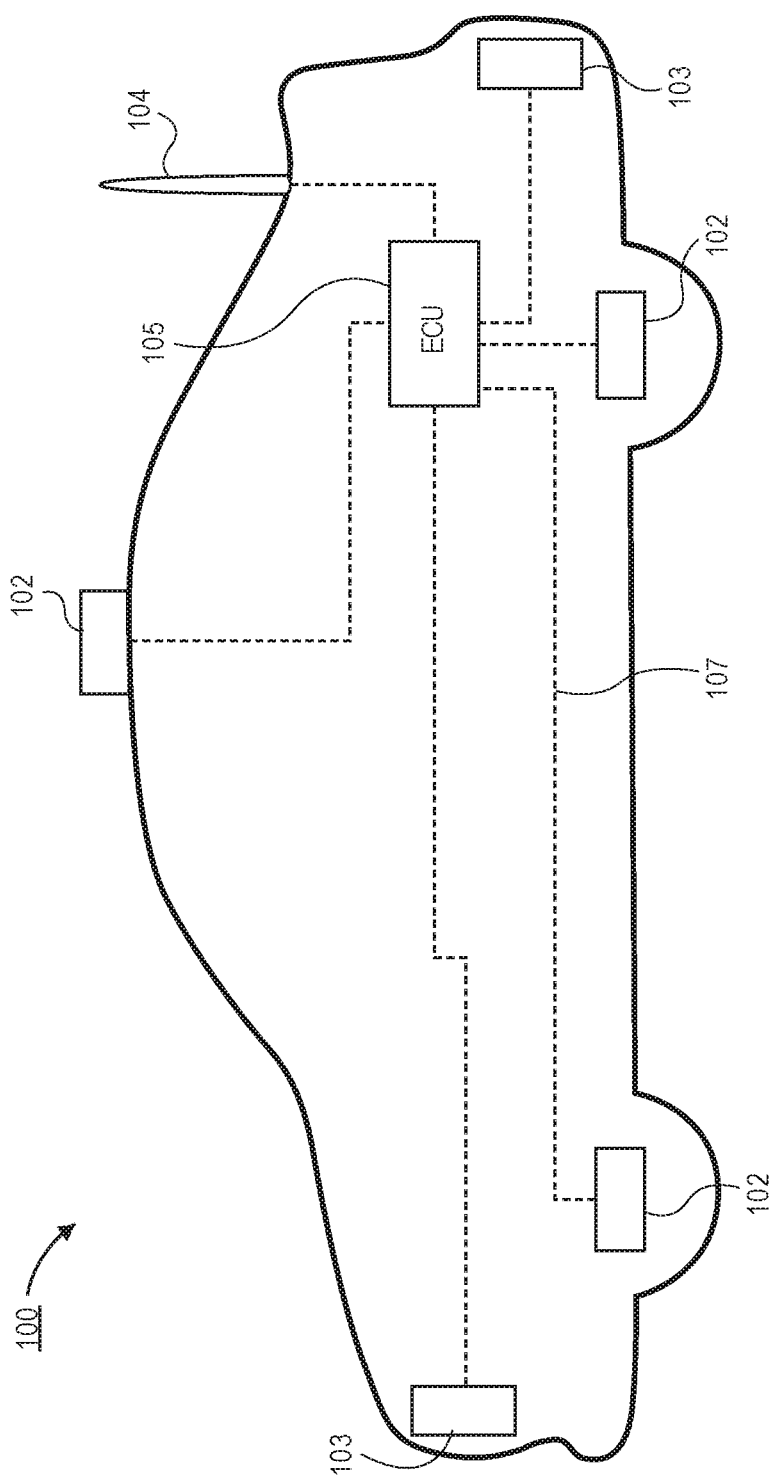
FIG. 1 is a schematic of an automobile that includes a plurality of sensors and other peripheral components that are communicatively linked to an electronic control unit (ECU), according to an embodiment of the invention.

Described herein are systems that include mm-wave interconnects that are used in autonomous and/or self-driving vehicles, according to embodiments of the invention. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, currently available interconnect solutions (i.e., electrical cables and optical cables) do not satisfy data rate, power consumption, latency, and cost targets needed for autonomous and/or self-driving vehicles (e.g., cars, trucks, trains, boats, planes, and any other autonomous transportation/cargo vehicle). Accordingly, embodiments of the invention include millimeter-wave waveguide (mm-wave waveguide) interconnect solutions. In an embodiment, the mm-wave waveguide comprises a dielectric waveguide bundle that is made out of low loss coated or uncoated dielectric materials designed to operate in the mm-wave or sub-THz frequency range. The waveguides may be coupled at both ends to a package that includes a mm-wave engine. In short to medium length cables (e.g., 0.5-15 meters or greater), the mm-waveguide cables provide a low power, low latency, high-speed, and low cost solution. Particularly, since signals do not need to be up-converted to an optical signal, the power consumption is significantly lower than the power consumption of the alternative optical fiber interconnect technology. Additionally, in the short to medium length cables, there may be no need for error correction (EC), since achieved bit-error-rate level rates are very low (below 10E-12). Therefore, the achieved latency may be significantly lower compared to the traditional electrical interconnect especially at high datarates, where EC is needed.

While mm-wave waveguides provide improved performance, particularly in short to medium length cables, there still may be situations where other interconnect technologies are desired (e.g., the latency and data rates may be non-critical in some systems, such as infotainment systems). Additionally, completely replacing and/or redesigning electronic control units (ECUs) in presently available vehicles may not be a cost effective solution in all situations. Accordingly, embodiments of the invention include mm-waveguide cables that utilize a pluggable architecture that can achieve a "plug and play" system with existing and future products. The use of such plug and play mm-waveguide cables provides several advantages.

One such advantage is that plug and play mm-waveguide cables may be used with existing ECUs while at the same time allowing for other interconnect technologies to be used interchangeably, depending on the needs of the system. The interchangeability between interconnect technologies is made possible by using active mm-wave interconnects. As used herein, an active mm-wave interconnect is a cable that includes a mm-wave engine that is integrated with the cable. For example, an active mm-wave engine may include circuitry and other components for converting signals to or from mm-wave signals and transmitting the mm-wave signals along the mm-waveguide, as will be described in greater detail below. Particularly, embodiments may include a mm-wave engine that is located in a connector that interfaces with predefined interfaces that are typically included in existing ECUs. For example, the connector of the active mm-wave interconnect may be a small form-factor pluggable (SFP), a quad small form-factor pluggable (QSFP), an octal small form-factor pluggable (OSFP), or the like. Since the components needed to provide mm-wave interconnects may be entirely integrated into an external cable, a user may simply plug the active mm-wave interconnect into the ECU without needing access to internal components of the system.

Embodiments that include such plug and play mm-waveguide interconnect architectures are also agnostic of the platform that is being used. Since the technology of the interconnect does not impose any packaging or system specifications on the ECU, the cost of these systems may be reduced. Furthermore, since the packaging of the active mm-wave interconnect is independent of the expensive CPU organic package in the ECU, embodiments enable the use of a low-cost package for the mm-wave engine.

Additional embodiments of the invention may also include integrating the mm-wave engine into the ECU while still maintaining separate packaging for the CPU and the mm-wave engine. Such embodiments may still benefit from decoupling the mm-wave engine package from the CPU packaging in order to provide lower overall system costs. Furthermore, in such embodiments additional components that would otherwise need to be packaged with the CPU package may be packaged with the mm-wave engine instead. For example, a predefined digital interconnect interface die may be integrated on the mm-wave packaging substrate. This allows for the use of different predefined digital interconnect interface dies without affecting the complex server package layout and/or design. As such, a customer has additional flexibility and control over the design of the system. However, in some embodiments, where the additional flexibility and control over the design is not needed, the ECU may include a mm-wave engine that is packaged on the same packaging substrate as the CPU or on the ECU printed circuit board.

Figure 2A:
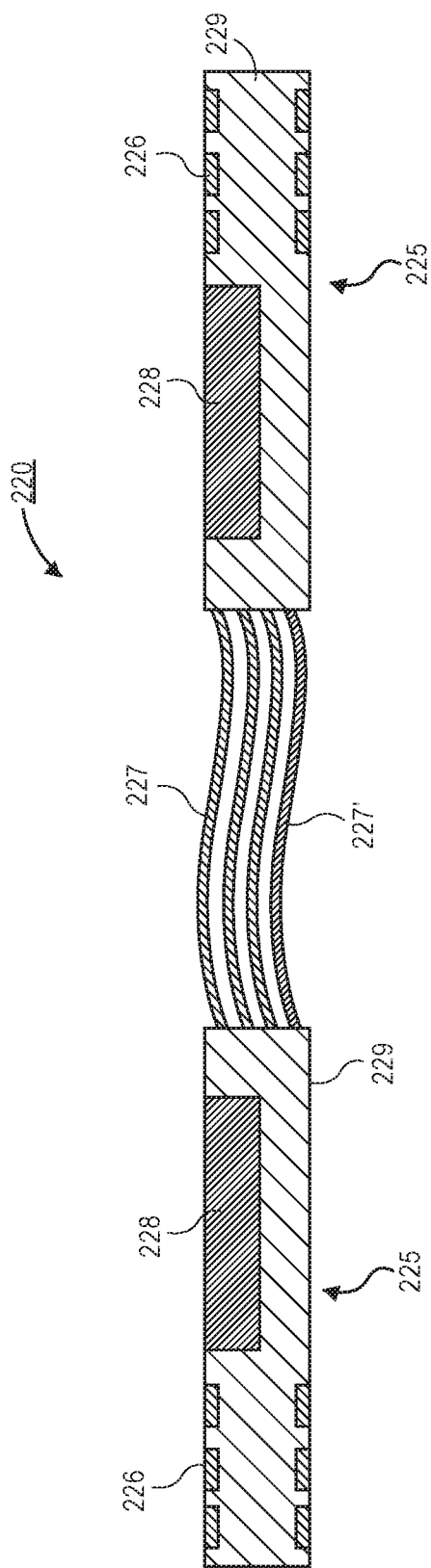
FIG. 2A is a cross-sectional illustration of an active mm-wave interconnect with pluggable connectors, according to an embodiment of the invention.

Referring now to FIG. 2A, a cross-sectional illustration of an active mm-wave interconnect 220 is shown, according to an embodiment of the invention. In an embodiment, the active mm-wave interconnect 220 includes one or more dielectric waveguides 227 suitable for propagating mm-wave signals. The dielectric waveguides 227 may be any suitable dielectric material, such as liquid crystal polymer (LCP), low-temperature co-fired ceramic (LTCC), glass, polytetrafluoroethylene (PTFE), expanded PTFE, low-density PTFE, ethylene tetrafluoroethylene (ETFE), fluorinated ethylene propylene (FEP), polyether ether ketone (PEEK), perfluoroalkoxy alkanes (PFA), combinations thereof, or the like. In an embodiment, the dielectric waveguides may have any shaped cross section, including, but not limited to, rectangular (with or without rounded corners), square, circular, oval, among others. In an embodiment, the dielectric waveguides 227 may also include a metallic coating (not shown) to provide electrical shielding to the dielectric waveguide. In some embodiments, the metallic coating of a dielectric waveguide may be used as a power line. For example, power may be applied on a shield along dielectric waveguide 227'. While a single dielectric waveguide is shown as carrying a powerline, it is to be appreciated that any number of the dielectric waveguides (e.g., from zero to all) of the dielectric waveguides 227 may be used as support for powerlines.

In the illustrated embodiment, four separate dielectric waveguides 227 and 227' are illustrated in the active mm-wave interconnect 220. However, embodiments are not limited to any specific number of dielectric waveguides. For example, there may be a single dielectric waveguide 227 or a bundle of two or more dielectric waveguides 227 (with or without copper powerlines) in each active mm-wave interconnect 220. In an embodiment, the dielectric waveguides 227 may be short to medium length cables. For example, the length of the dielectric waveguides may be between approximately 0.5 meters and 15 meters.

In an embodiment, each end of the dielectric waveguides 227 may be coupled to a connector 225. According to an embodiment, the connector 225 includes a mm-wave engine 228 that is packaged on a mm-wave packaging substrate 229. In the illustrated embodiment, the connector 225 is shown without a protective enclosure in order to not obscure the Figure. However, it is to be appreciated that the connector 225 may include multiple different packaging substrates, protective enclosures, heat management solutions, and other needed components. For example, the mm-wave engine 228 may be packaged on a packaging substrate 228 and may be substantially enclosed by a protective casing. Furthermore, while the mm-wave engine 228 is illustrated as a single block, it is to be appreciated that the mm-wave engine 228 may include any number of discrete dies, interconnects, and/or other components that will be described in greater detail below.

In an embodiment, the connectors 225 are able to be plugged into an interface on computing system (e.g., an ECU, or the like). Embodiments of the invention may include connectors 225 that are pluggable into predefined interfaces. For example, typical predefined interfaces that may be used include SFP and QSFP interfaces. As illustrated, the connectors 225 may each include contacts 226 that electrically couple the mm-wave guide engine 228 to the predefined interface. While not shown, it is to be appreciated that conductive traces and vias may be formed between the contacts 226 and the mm-wave engine 228. In the illustrated embodiment, the contacts 226 are illustrated as pads. However, embodiments are not limited to such configurations. For example, the contacts 226 may be pins or any other known contact.

Figure 2B:
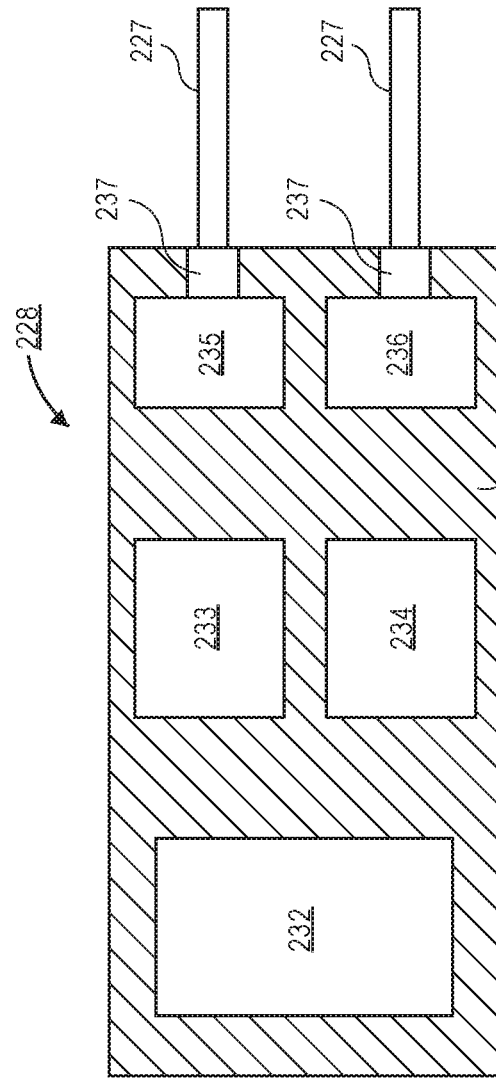
FIG. 2B is a schematic illustration of the mm-wave engine, according to an embodiment of the invention.

Referring now to FIG. 2B, a schematic diagram of the mm-wave engine 228 is shown in more detail, according to an embodiment of the invention. In an embodiment, the mm-wave engine 228 may include a power supply and management die 232. Additional embodiments may include a modulator die 233 and a demodulator die 234. In some embodiments, the modulator die 233 and the demodulator die 234 may be integrated on a single die. Embodiments may also include a mm-wave transmitter (Tx) die 235 and a mm-wave receiver (Rx) die 236. In some embodiments the Tx die 235 and the Rx die 236 may be integrated on a single die. Additional embodiments may also include any number of components being integrated on a single die. In another embodiment, the mm-wave engine 228 may be a transmitting mm-wave engine or a receiving mm-wave engine. In such embodiments, the transmitting mm-wave engine may include a Tx die 235 and a modulator die 233 and the receiving mm-wave engine may include an Rx die 236 and a demodulator die 234. The components may also be formed on any suitable semiconductor material. For example, the dies may be silicon dies, III-V material dies, silicon on insulator (SOI) dies, III-V materials integrated on a single die with silicon, silicon germanium, (SiGE) dies, or any other combination of semiconductor materials. In an embodiment, the mm-wave engine 228 may include a launcher 237 that is used to launch and assist the propagation of the mm-wave signal along the dielectric waveguide 227 or a bundle of dielectric waveguides 227 (e.g., two or more dielectric waveguides separated by air, another dielectric material, or metal). In some embodiments, the launcher 237 may be integrated with a waveguide connector that mechanically and communicatively couples the dielectric waveguide 227 to the launcher 237. The launcher 237 may be any known launcher for initiating the propagation of mm-waves or receiving mm-waves, such as regular single patch launcher, a stacked-patch launcher, a microstrip-to-tapered slot transition launcher, etc.

Figure 2C:
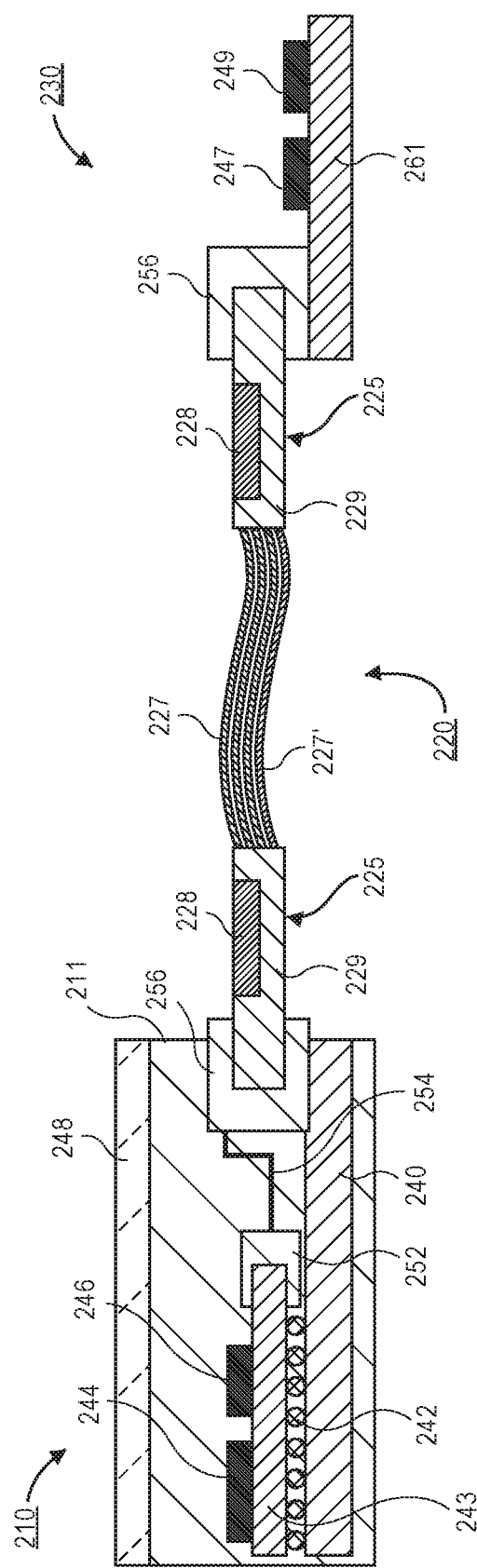
FIG. 2C is a cross-sectional illustration of an active mm-wave interconnect with pluggable connectors that is plugged into an ECU and a sensor, according to an embodiment of the invention.

Referring now to FIG. 2C, a cross-sectional illustration of an active mm-wave interconnect 220 plugged into an ECU 210 and a sensor 230 is shown, according to an embodiment of the invention. Since the active mm-wave interconnect 220 is agnostic to the underlying architecture of the ECU 210 and the sensor 230, embodiments of the invention may include an ECU 210 and/or sensor 230 that include any architecture.

In an embodiment, the ECU 210 may include a central processing unit (CPU) die 244 that is packaged on a packaging substrate 243. The packaging substrate 243 may be coupled to an ECU printed circuit board (PCB) 240 by solder bumps 242, such as a ball grid array (BGA), a land grid array (LGA), a socket, or any other known interconnect. In some embodiments, a predefined digital interconnect interface die 246 electrically coupled between CPU die 244 and the mm-wave engine 228 may also be packaged on the same packaging substrate 243 on which the CPU die 244 is packaged. For example, the predefined digital interconnect interface die 246 may translate and/or condition a signal so that signals may pass between the CPU die 244 and the mm-wave engine 228 of the active mm-wave interconnect 220 even when the output of either of the CPU die 244 or the mm-wave engine 228 does not match the type of input expected by the other component. In some embodiments a heatsink 248 or any other thermal management technology may also be included in the ECU 210. For example, the heatsink 248 may be a liquid cooled heatsink 248, such as one that is connected to the cooling systems in the autonomous vehicle. In the illustrated embodiment, the heatsink 248 is formed over a surface of an ECU enclosure 211. However, the heatsink 248 may be within the ECU enclosure 211 in some embodiments of the invention.

Embodiments of the invention may include a predefined interface 252 that couples the CPU packaging substrate 243 to a first end of an internal cable 254. The internal cable 254 may be any suitable electrical cable, such as a twinaxial cable, or the like. The internal cable 254 may extend to the edge of the ECU enclosure 211 where it is coupled to an external predefined interface 256. The external predefined interface 256 may be any suitable interface. For example, the external predefined interface 256 may be a SFP, a QSFP, or the like.

In an embodiment, the sensor 230 may include a central processing unit (CPU) die 249 that is packaged on a packaging substrate 261. In some embodiments, a predefined digital interconnect interface die 247 communicatively coupled between CPU die 249 and the mm-wave engine 228 of the mm-wave interconnect 220 may also be packaged on the same packaging substrate 261 on which the CPU die 249 is packaged. For example, the predefined digital interconnect interface die 247 may translate and/or condition a signal so that signals may pass between the CPU die 249 and the mm-wave engine 228 even when the output of either of the CPU die 249 or the mm-wave engine 228 does not match the type of input expected by the other component. In an embodiment, an external predefined interface 256 may communicatively couple the mm-wave engine 228 to the predefined digital interconnect interface die 247. The external predefined interface 256 may be any suitable interface. For example, the external predefined interface 256 may be a SFP, a QSFP, or the like. It is to be appreciated that the sensor 230 may include any other needed components, such as interconnects, an enclosure, or the like, and is represented here in a simplified manner in order to not obscure embodiments of the invention. Furthermore, it is to be appreciated that while a sensor 230 is depicted, embodiments of the invention may include any other component that may need to transmit and/or receive data to/from the ECU 210.

According to an embodiment of the invention, the active mm-wave interconnect 220 may be plugged into the external predefined interfaces 256 of the ECU 210 and the sensor 230. For example, a first connector 225 of the active mm-wave interconnect 220 may be plugged into the external predefined interface 256 of the ECU 210, and a second connector 225 may be coupled to a predefined interface 256 of the sensor 230 or any other component. Accordingly, the active mm-wave interconnect 220 may be external to the ECU 210 and/or sensor 230. Therefore, the architecture of the ECU 210 and/or the sensor 230 may not impose any packaging or design restrictions on the mm-wave engines 228 used in the active mm-wave interconnect 220. This allows for the overall cost of the active mm-wave interconnect 220 to be reduced since the packaging may not need to be as sophisticated as that of the CPU package substrate 243 of the ECU 220 or of the packaging substrate 261 of the sensor 230. Furthermore, embodiments may include an active mm-wave interconnect 220 that includes one or more dielectric waveguides 227 that also function as power lines 227', or include one or more dielectric waveguides 227 combined with copper powerlines. As such, power may be delivered from the ECU 210 to the sensor 230 without the need for an extra power source for each peripheral component.

While it may be particularly beneficial to have the mm-wave engine external to the ECU in order to provide plug and play functionality, in some embodiments the mm-wave engine may also be integrated within the ECU and/or sensor. In such embodiments, the mm-wave engine may still be packaged on a different packaging substrate than the CPU packaging substrate. Accordingly, the architecture and layout of the CPU packaging is still not affected by the inclusion of the mm-wave guide engine.

Figure 3A:
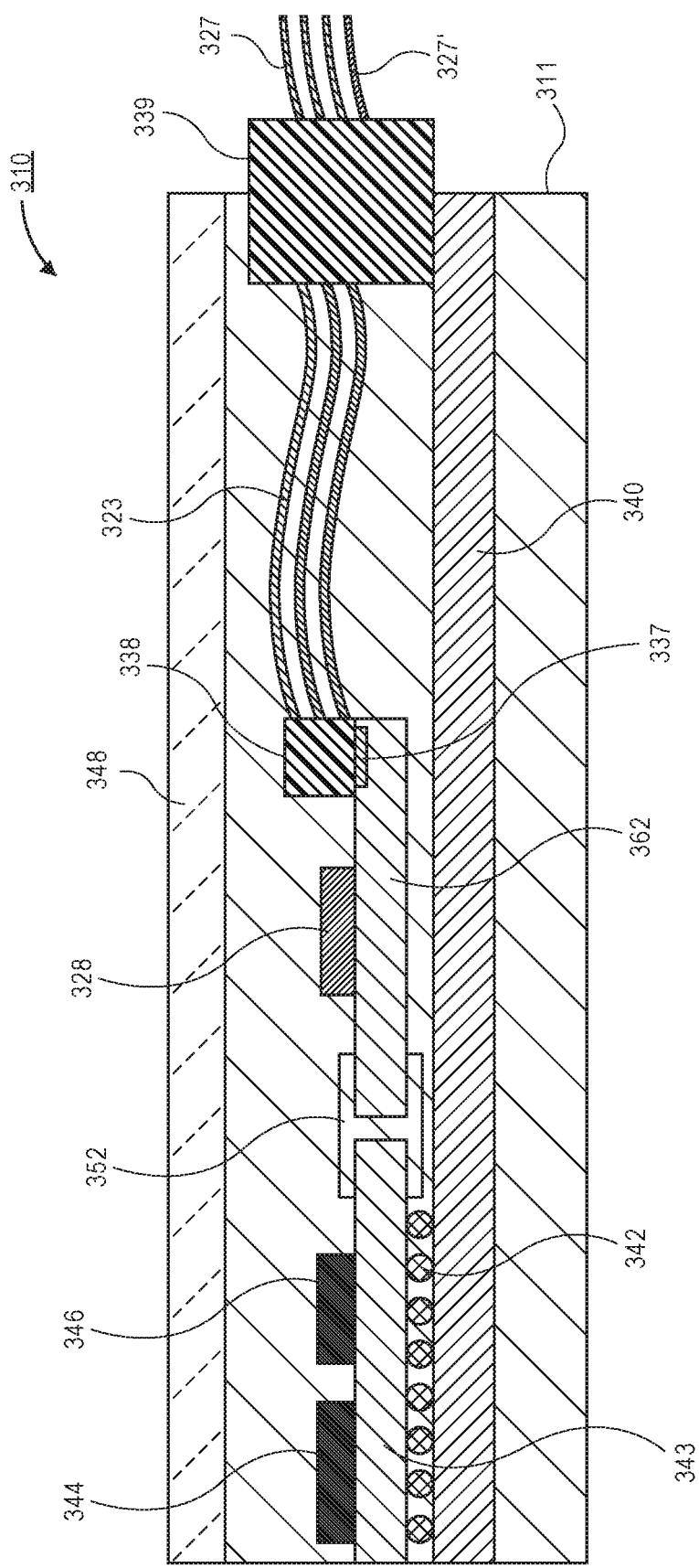
FIG. 3A is a cross-sectional illustration of an ECU that includes an active mm-wave interconnect attached inside the ECU and coupled to a waveguide connector at the edge of the ECU, according to an embodiment of the invention.

Referring now to FIG. 3A, a cross-section illustration of a mm-wave engine 328 packaged within the ECU 310 is shown, according to an embodiment of the invention. In an embodiment, the ECU 310 may be substantially similar to the ECU 210 described above with the exception that the mm-wave engine 328 may be packaged inside the ECU enclosure 311. In an embodiment, the mm-wave packaging substrate 362 may be coupled to the CPU packaging substrate 343 by a predefined digital interface 352. As such, the mm-wave packaging substrate 362 is independent of the CPU organic packaging substrate 343, and allows for the use of mm-wave appropriate substrates and stack-ups. This may enable better performance of the mm-wave system compared to direct integration of the mm-wave engine 328 with the CPU package 343.

In the illustrated embodiment, the launcher 337 and waveguide connector 338 are also illustrated as discrete components from the mm-wave engine 328. While illustrated as being located on a top surface of the mm-wave packaging substrate 362, it is to be appreciated that the waveguide connector 338 and the launcher 337 may be formed at any location, including the bottom surface of the mm-wave packaging substrate 362 or embedded within the mm-wave packaging substrate 362. In an additional embodiment, the waveguide connector 338 and/or the launcher 337 may be overmolded. In the illustrated embodiment, the mm-wave packaging substrate 362 is only supported by the predefined digital interface 352, however it is to be appreciated that additional mechanical supports (not shown) may also be used to provide improved mechanical reliability to the system.

In an embodiment, one or more internal dielectric waveguides 323 may be coupled to the waveguide connector 338 and run substantially to the edge of the ECU enclosure 311. The internal dielectric waveguides 323 may be substantially similar to the dielectric waveguides 227 described above. In some embodiments, the dielectric waveguide 323 may be connected to a passive pluggable connector 339. The passive pluggable connector 339 may couple the internal dielectric waveguides 323 that are inside the ECU 310 to dielectric waveguides 327 that are external to the ECU 310. In such embodiments, the external dielectric waveguides 327 may be referred to as passive dielectric waveguides 327 since they do not require a dedicated mm-wave engine since the conversion to mm-wave signals occurs within the ECU 310. Accordingly, the external dielectric waveguides 327 may be considerably less expensive to manufacture since they do not require the additional circuitry needed for the mm-wave conversion. In the illustrated embodiment, only a first end of the dielectric waveguides 327 are shown for simplicity, but it is to be appreciated that the second ends of the dielectric waveguides 327 may be coupled to a sensor or other component with substantially the same configuration. According to an embodiment, one or more of the external dielectric waveguides 327 may be a dielectric waveguide 327' (or a copper powerline 327') that carries power from the ECU 310 to an external component, such as a sensor or the like.

Figure 3B:
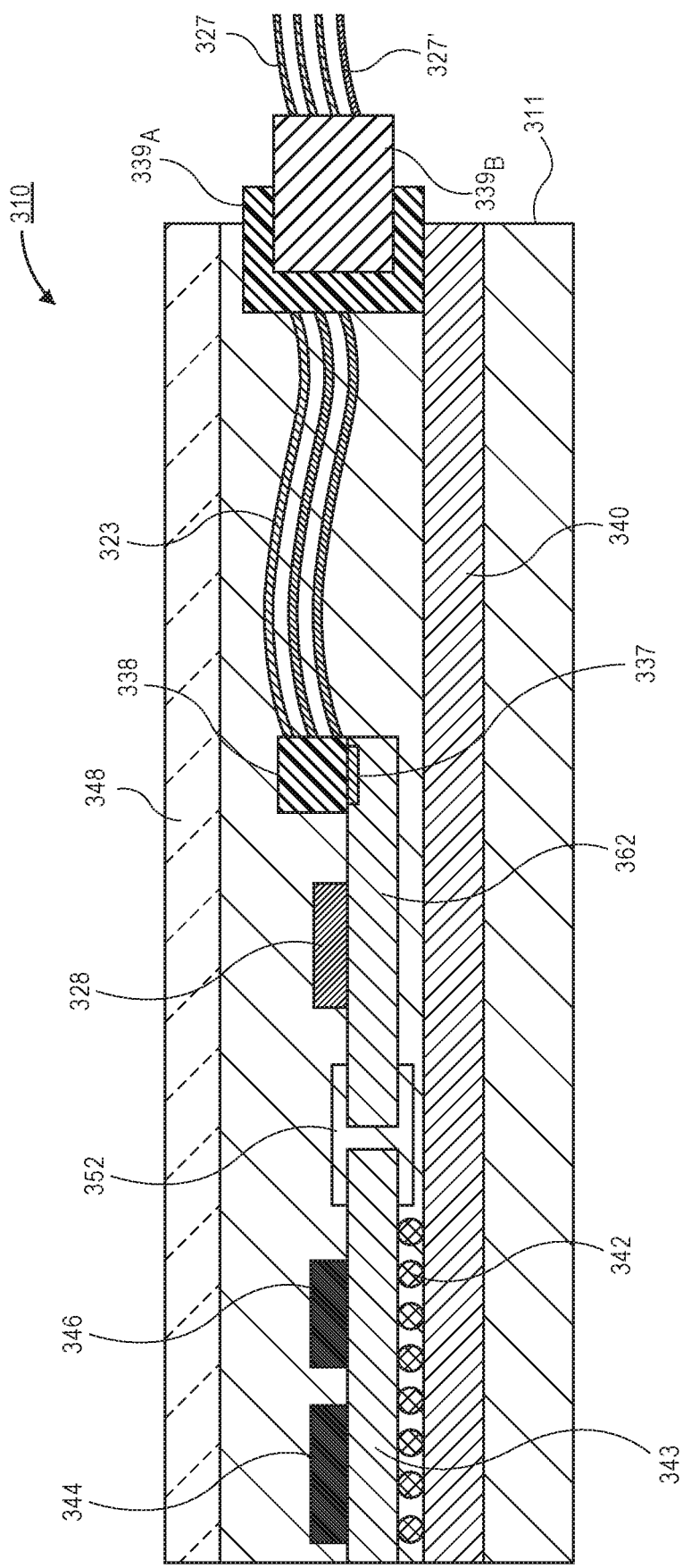
FIG. 3B is a cross-sectional illustration of an ECU that includes an active mm-wave interconnect attached inside the ECU and coupled to a detachable waveguide connector at the edge of the ECU, according to an embodiment of the invention.

Referring now to FIG. 3B, a cross-sectional illustration of an embodiment of the invention that is substantially similar to the embodiment illustrated in FIG. 3A is shown, with the exception that the passive pluggable connector 339 is shown as a male-female plug. In such embodiments, the female portion $339_A$ of the repeater may be a positioned at the edge of the ECU enclosure 311 and the male portion $339_B$ may be inserted from outside the ECU enclosure 311. In an additional embodiment, the male portion $339_B$ may be positioned at the edge of the ECU enclosure 311, and the female portion $339_A$ may be coupled over the male portion $339_B$ from outside the ECU enclosure 311. Accordingly, the passive dielectric waveguides 327 may be replaced by switching out an external cable only, without needing to alter any components of the ECU 310. This may allow for simple changes to the system (e.g., to change the length of the cable or replace a damaged cable).

Figure 3C:
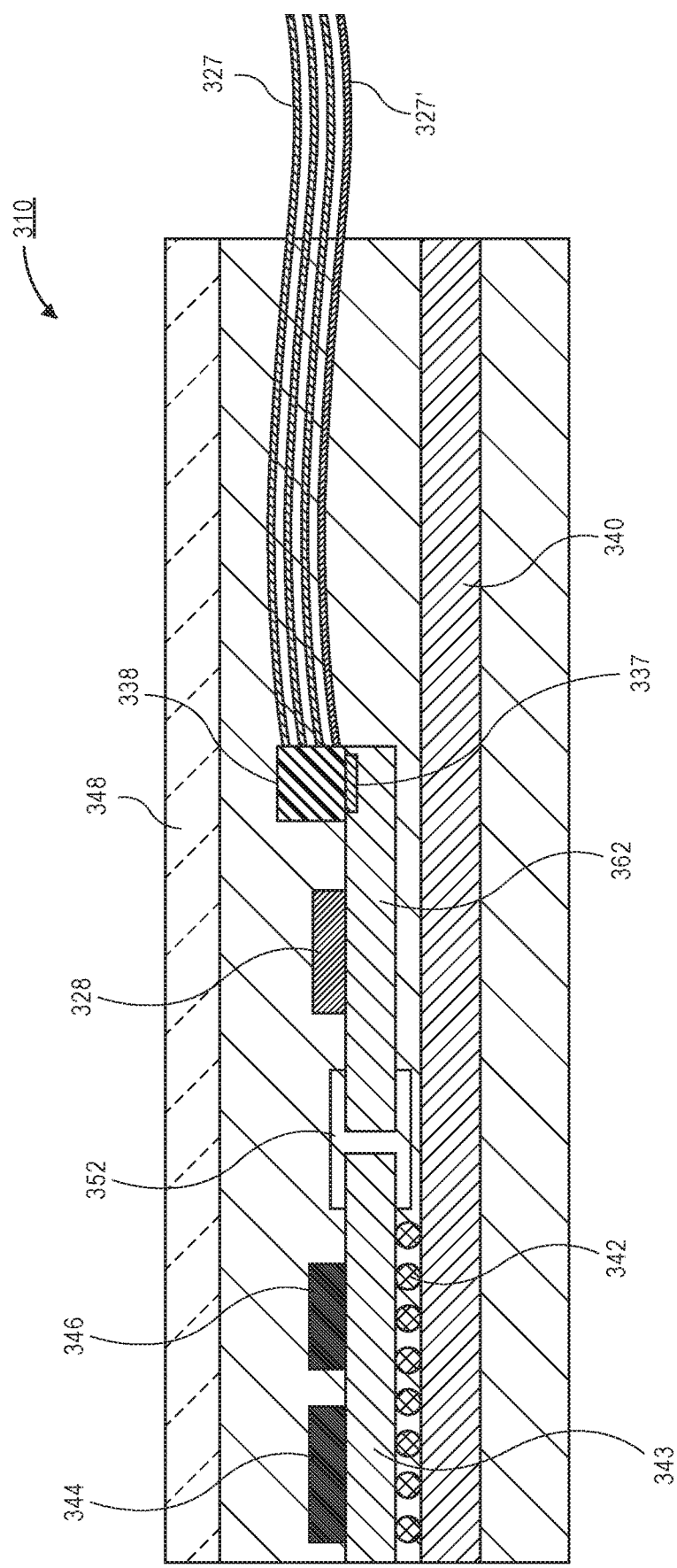
FIG. 3C is a cross-sectional illustration of an ECU that includes an active mm-wave interconnect attached inside the ECU and extending out of the ECU without a waveguide connector, according to an embodiment of the invention.

Referring now to FIG. 3C, a cross-sectional illustration of an embodiment of the invention that is substantially similar to the embodiment illustrated in FIG. 3A is shown, with the exception that dielectric waveguides 327 may leave ECU 310 without any waveguide connector at the edge of the ECU enclosure 311. In an embodiment, the dielectric waveguides 327 may extend out from the ECU 310 and still have sufficient length to make interconnects with other systems. In such an embodiment, the second end of the dielectric waveguides 327 that are not shown may have a connector similar to connectors 225 described above. As such, the active mm-wave interconnect may allow for plug and play functionality. Alternative embodiments may also include a second end of the mm-wave interconnect that is coupled to a mm-wave engine within a sensor or other component, similar to the first end illustrated in FIG. 3C. While the dielectric waveguides 327 are illustrated as passing directly through the ECU enclosure 311, it is to be appreciated that additional mechanical supports may be present at the wall of the ECU enclosure 311 in order to survive shock and vibration events, and to provide a measure of strain relief to the termination of the dielectric waveguide 327. By removing the need for a waveguide connector at the edge of the ECU box, embodiments may allow for improved performance since additional alignment errors, signal reflections, and insertion losses may be avoided since fewer connections/transitions are needed.

According to an additional embodiment of the invention, a predefined digital interconnect interface die may also be integrated on the same substrate as the mm-wave engine. An example of such an embodiment is illustrated with respect to FIG. 4A. FIG. 4A is substantially similar to FIG. 3A, with the exception that the predefined digital interconnect interface die 446 is removed from the CPU packaging substrate 443 and is located on the mm-wave engine packaging substrate 462. Such embodiments allow for greater flexibility in the choice of which predefined digital interconnect interface die 446 is chosen for the system. For example, a predefined digital interconnect interface die obtained from any manufacturer may be used without affecting the complex ECU package layout and/or design. Additionally, removing the predefined digital interconnect interface die 446 from the CPU packaging substrate 443 may provide additional space on the CPU packaging substrate 443 to allow for increased memory or the like to be added to the ECU 410.

When moving the predefined digital interconnect interface die 446 to the mm-wave engine packaging substrate 462, the predefined interconnect 452 between the mm-wave engine packaging substrate 462 and the CPU packaging substrate 443 may need to be modified. For example, when the predefined digital interconnect interface die 446 is a serializer/deserializer (SERDES) die, the predefined digital interconnect interface die 446 receives input signals from a plurality of pins (e.g., ten or more) from the CPU and serializes these inputs for transmission along a single output pin. Accordingly, when the predefined digital interconnect interface die 446 is moved to the mm-wave engine packaging substrate 462, it may be necessary to increase the number of conductive traces that pass through the predefined interconnect 452.

Referring now to FIG. 4B, an enlarged cross-sectional illustration of the predefined interconnect 452 is shown according to an embodiment of the invention. As illustrated, the plurality of signal lines may be accommodated by providing contact pads 445, 465 along the top surface and the bottom surfaces of both the CPU packaging substrate 443 and the mm-wave engine packaging substrate 462. Additional embodiments may also include contacts along the edge surface of the packaging substrates. The predefined interconnect 452 may therefore, include a plurality of traces 453 and corresponding pins 451 to provide electrical connections between corresponding contact pads 445, 465. As such, embodiments are able to provide the pin density needed to pass signals from the CPU die 444 to the predefined digital interconnect interface die 446 over the predefined interconnect 452.

Figure 5A:
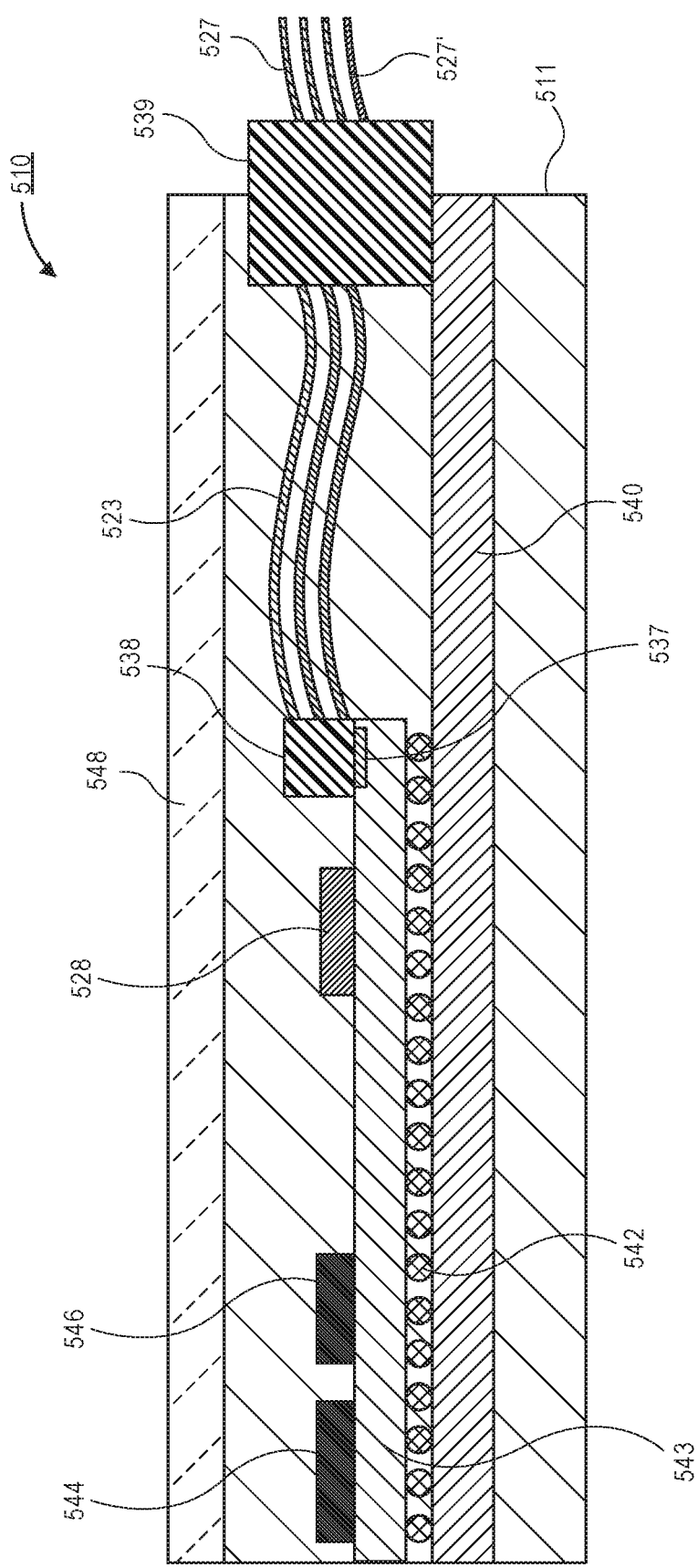
FIG. 5A is a cross-sectional illustration of an ECU that includes an active mm-wave interconnect mounted on the CPU package substrate inside the ECU and coupled to a waveguide connector at the edge of the ECU, according to an embodiment of the invention.
Figure 5B:
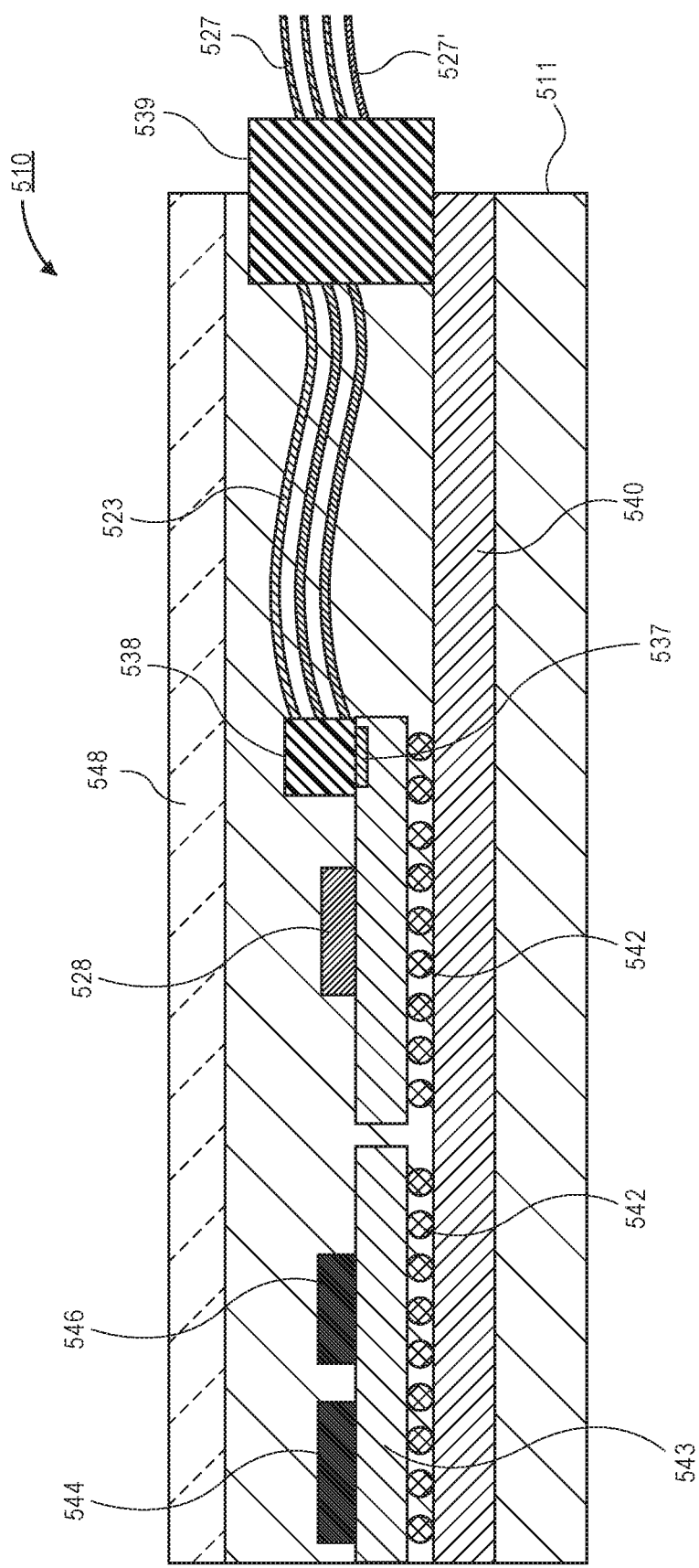
FIG. 5B is a cross-sectional illustration of an ECU that includes an active mm-wave interconnect mounted on a package substrate that is coupled to the PCB substrate, according to an embodiment of the invention.

Additional embodiments of the invention may also include any packaging configuration where the mm-wave engine is packaged within the ECU enclosure. For example, FIG. 5A is a cross-sectional illustration of an ECU 510 where the mm-wave engine 528 is packaged on the same packaging substrate 543 as the CPU die 544, according to an embodiment of the invention. In such an embodiment, the predefined interface die 546 may be communicatively coupled to the mm-wave engine 528 by one or more traces (not shown) within the CPU packaging substrate 543. In yet another embodiment, the mm-wave engine 528 may remain on a distinct packaging substrate 562, but be communicatively coupled to the predefined interface die 546 through traces (not shown) in the ECU PCB 540, as is illustrated in FIG. 5B. While several examples of packaging configurations are illustrated in the Figures described above, it is to be appreciated that autonomous and/or self-driving vehicles may use any arrangement of the components to form communication pathways that utilize mm-wave interconnects, according to additional embodiments of the invention.

As described above, active and/or passive mm-wave interconnects may be used to provide interconnects between an ECU and one or more sensors or other components in an autonomous and/or self-driving vehicle. Furthermore, it is to be appreciated that the main direction of data traffic between the ECU and a sensor will be the sensor transmitting data to the ECU. Accordingly, some embodiments may include an asymmetrical transceiver architecture. The use of an asymmetrical transceiver architecture may provide power consumption benefits and a faster circuit design process.

Figure 6:
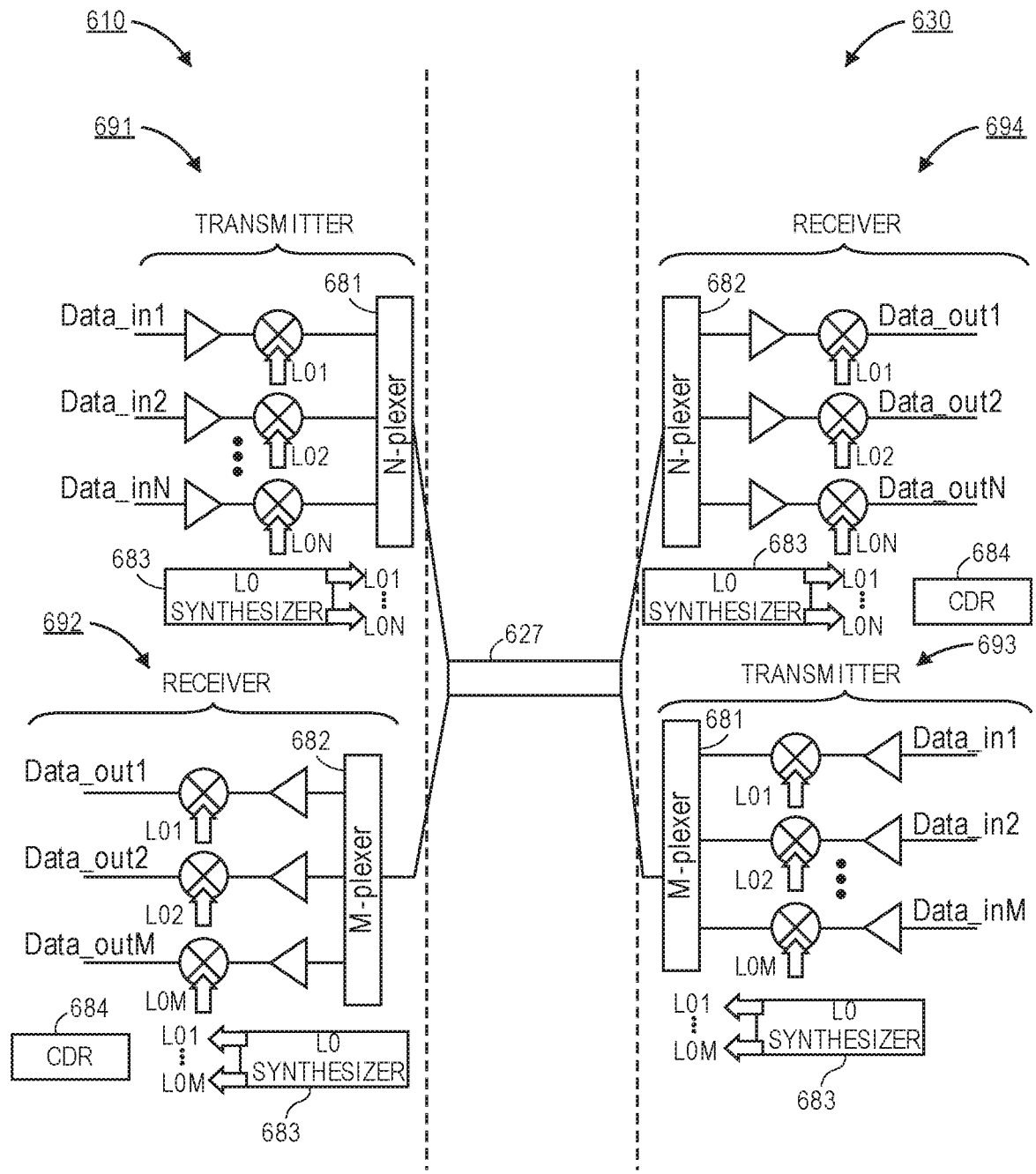
FIG. 6 is a block diagram of portions of an asymmetric transceiver architecture that may utilize a mm-wave interconnect between an ECU and a sensor, according to an embodiment of the invention.

Referring now to FIG. 6, a block diagram of an asymmetrical transceiver architecture that may be used in an autonomous and/or self-driving vehicle is shown, according to an embodiment. The block diagram illustrates an ECU side 610 and a sensor side 630 that is connected by a mm-wave interconnect 627. In an embodiment, the ECU, the sensor, and the mm-wave interconnect may be substantially similar to one or more of the embodiments described above. In an embodiment, the ECU side 610 may include a transmitter block 691 and a receiver block 692, and the sensor side 630 may include a transmitter block 693 and a receiver block 694. In order to account for the asymmetric data transfer, the transmitter block 693 on the sensor side 630 may support a number of bands M that is greater than the number of bands N supported by the transmitter block 691 on the ECU side 610. In the illustrated embodiment, each block includes a multiplexer 681 or demultiplexer 682 for multiplexing/demultiplexing M or N bands. Alternatively, instead of utilizing multiplexers/demultiplexers, embodiments may channelize the signals by using polarization diversity. Additionally, the transceiver architecture may include any needed local oscillators (LO) 683 at each block, and a clock and data recovery (CDR) block 684 at each receiver block 692/694. Embodiments may also include any other needed blocks typically used in transceiver architectures, such as, equalization blocks, cyclic redundancy check (CRC) decoding blocks, dispersion compensation circuitry, analog filtering, splitters/combiners, voltage controlled oscillators (VCOs), digitally controlled oscillators (DCOs), power management blocks, or the like. Additional embodiments of the invention may implement an asymmetric communication by having programmable bands of communications over frequency division multiple access (FDMA), where it has been predefined which M frequency-bands are to be used for ECU to sensor communication and which N frequency-bands are to be used for sensor to ECU communication.

Figure 7:
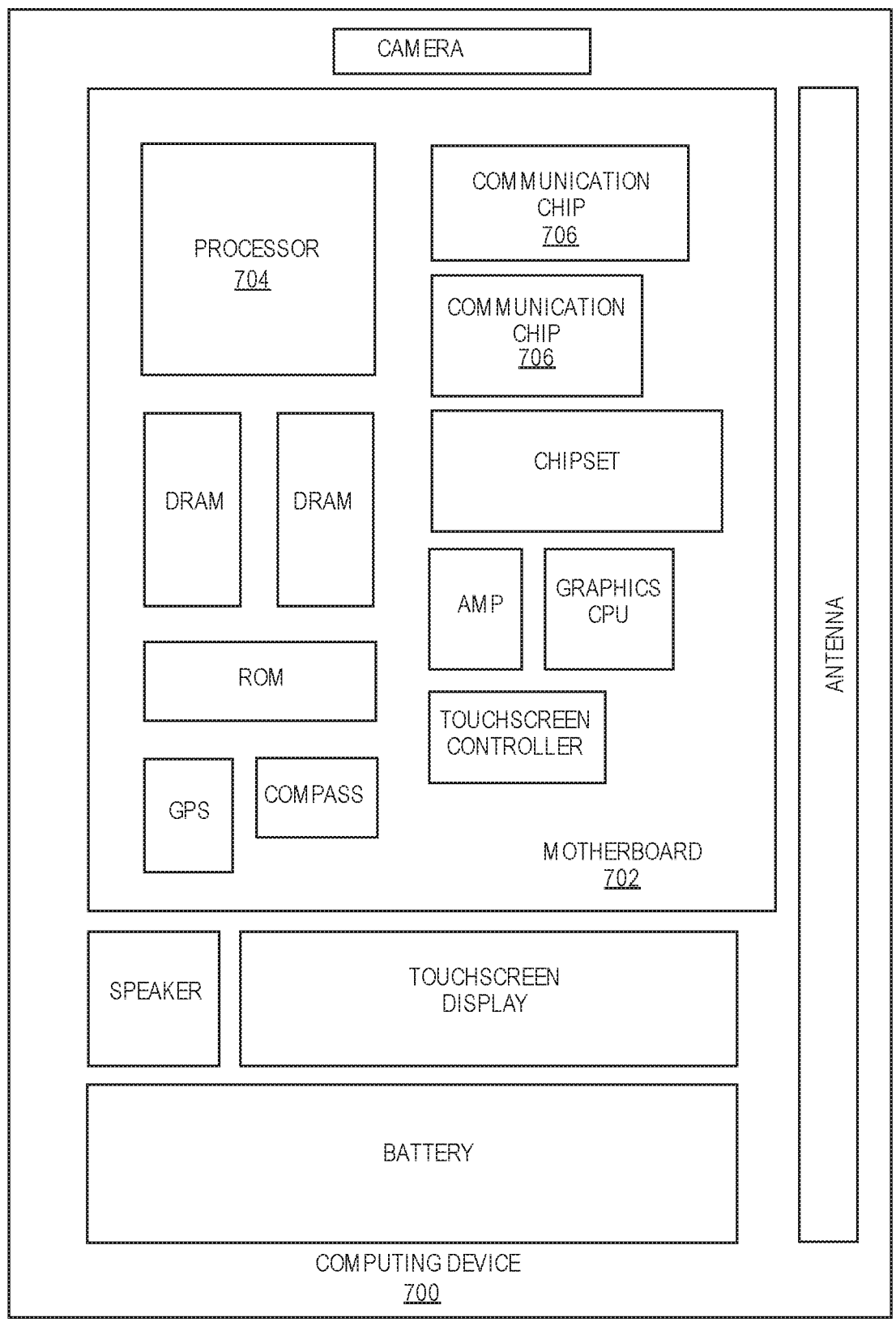
FIG. 7 is a schematic of a computing device built in accordance with an embodiment of the invention.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704. In yet another implementation, the communication chip 706 may function as a predefined interface (e.g., a serializer/deserializer, or the like).

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor may be packaged on an organic substrate and provide signals that are converted to a mm-wave signal and propagated along an active mm-wave interconnect, in accordance with implementations of the invention. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip may be packaged on an organic substrate and provide signals that are converted to a mm-wave signal and propagated along an active mm-wave interconnect, in accordance with implementations of the invention.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a vehicle, comprising: an electronic control unit (ECU), wherein the ECU comprises: a printed circuit board (PCB); and a central processing unit (CPU) die packaged on a CPU packaging substrate, wherein the CPU packaging substrate is electrically coupled to the PCB; and an external predefined interface electrically coupled to the CPU die; and an active mm-wave interconnect, wherein the active mm-wave interconnect comprises: a dielectric waveguide; a first connector coupled to a first end of the dielectric waveguide, wherein the first connector comprises a first mm-wave engine, and wherein the first connector is electrically coupled to the external predefined interface; and a second connector coupled to a second end of the dielectric waveguide, wherein the second connector comprises a second mm-wave engine.

Example 2: the vehicle of Example 1, further comprising: a sensor, wherein the sensor comprises an external predefined interface, and wherein the second connector is coupled to the external predefined interface of the sensor.

Example 3: the vehicle of Example 1, or Example 2, wherein the sensor is a video camera, a positioning system, an ultrasonic sensor, a radar sensor, or a light detection and ranging (LIDAR) sensor.

Example 4: the vehicle of Example 1, Example 2, or Example 3, wherein the first and second mm-wave engines each comprise: a power management component; a modulator component and/or a demodulator component; and a mm-wave transmitter component and/or a mm-wave receiver component.

Example 5: the vehicle of Example 1, Example 2, Example 3, or Example 4, wherein the first mm-wave engine is packaged on a first mm-wave packaging substrate, and the second mm-wave engines is packaged on a second mm-wave packaging substrate.

Example 6: the vehicle of Example 1, Example 2, Example 3, Example 4, or Example 5, wherein two or more of the components of the mm-wave engine are fabricated on a single die.

Example 7: the vehicle of Example 1, Example 2, Example 3, Example 4, Example 5, or Example 6, wherein the dielectric waveguide is coupled to the first connector by a first waveguide connector attached to the first dielectric waveguide package, and the dielectric waveguide is coupled to the second connector by a second waveguide connector attached to the second mm-waveguide package.

Example 8: the vehicle of Example 1, Example 2, Example 3, Example 4, Example 5, Example 6, or Example 7, wherein the first connector and the second connector are predefined interface connectors.

Example 9: the vehicle of Example 1, Example 2, Example 3, Example 4, Example 5, or Example 6, Example 7, or Example 8, wherein the predefined interface connectors are small form-factor pluggables (SFP), quad small form-factor pluggables (QSFP), or octal small form-factor pluggables (OSFP).

Example 10: the vehicle of Example 1, Example 2, Example 3, Example 4, Example 5, Example 6, Example 7, Example 8, or Example 9, wherein the active mm-wave interconnect has an asymmetrical transceiver architecture.

Example 11: the vehicle of Example 1, Example 2, Example 3, Example 4, Example 5, Example 6, Example 7, Example 8, Example 9, or Example 10, wherein the dielectric waveguide is between 0.5 meter and 15 meters in length.

Example 12: the vehicle of Example 1, Example 2, Example 3, Example 4, Example 5, Example 6, Example 7, Example 8, Example 9, Example 10, or Example 11, wherein the dielectric wave guide is covered with a metallic layer.

Example 13: the vehicle of Example 1, Example 2, Example 3, Example 4, Example 5, Example 6, Example 7, Example 8, Example 9, Example 10, Example 11, or Example 12, wherein the dielectric wave guide is formed from one or more of liquid crystal polymer (LCP), low-temperature co-fired ceramic (LTCC), glass, polytetrafluoroethylene (PTFE), expanded PTFE, low-density PTFE, ethylene tetrafluoroethylene (ETFE), fluorinated ethylene propylene (PEP), polyether ether ketone (PEEK), or perfluoroalkoxy alkanes (PFA).

Example 14: an electronic control unit (ECU) for a vehicle, comprising: a printed circuit board (PCB); a central processing unit (CPU) die packaged on a CPU packaging substrate, wherein the CPU packaging substrate is electrically coupled to the PCB; and a mm-wave engine packaged on a mm-wave engine packaging substrate, wherein the mm-wave engine packaging substrate is coupled to the CPU packaging substrate with a predefined interface.

Example 15: the ECU of Example 14, further comprising: a mm-wave launcher coupled to the mm-wave engine; a waveguide connector coupled to the mm-wave launcher; and a dielectric waveguide, wherein a first end of the dielectric waveguide is coupled to the waveguide connector.

Example 16: the ECU of Example 14 or Example 15, wherein a second end of the dielectric waveguide is coupled to a waveguide connector at an edge of the ECU enclosure.

Example 17: the ECU of Example 14, Example 15, or Example 16, wherein the waveguide connector is coupled to a second dielectric waveguide that extends past an edge of the ECU enclosure.

Example 18: the ECU of Example 14, Example 15, Example 16, or Example 17, wherein the waveguide connector comprises a female connector portion, and wherein the second dielectric waveguide is coupled to a male connector portion that is coupled with the female connector portion.

Example 19: the ECU of Example 14, Example 15, Example 16, Example 17, or Example 18, further comprising: a predefined digital interconnect interface die electrically coupled between the CPU die and the mm-wave engine.

Example 20: the ECU of Example 14, Example 15, Example 16, Example 17, Example 18, or Example 19, wherein the predefined digital interconnect interface die is packaged on the CPU packaging substrate.

Example 21: the ECU of Example 14, Example 15, Example 16, Example 17, Example 18, Example 19, or Example 20, wherein the predefined digital interconnect interface die is packaged on the mm-wave packaging substrate.

Example 22: the ECU of Example 14, Example 15, Example 16, Example 17, Example 18, Example 19, Example 20, or Example 21, wherein the dielectric waveguide is formed from one or more of polytetrafluoroethylene (PTFE), expanded PTFE, low-density PTFE, ethylene tetrafluoroethylene (ETFE), fluorinated ethylene propylene (FEP), polyether ether ketone (PEEK), or perfluoroalkoxy alkanes (PFA).

Example 23: the ECU of Example 14, Example 15, Example 16, Example 17, Example 18, Example 19, Example 20, Example 21, or Example 22, wherein the mm-wave engine comprises: a power management component; a modulator component and/or a demodulator component; and a mm-wave transmitter component and/or a mm-wave receiver component, wherein a transceiver architecture of the mm-wave engine is an asymmetrical architecture.

Example 24: a vehicle, comprising: an electronic control unit (ECU), wherein the ECU comprises: a printed circuit board (PCB); a central processing unit (CPU) die packaged on a CPU packaging substrate, wherein the CPU packaging substrate is electrically coupled to the PCB; and an external predefined interface electrically coupled to the CPU die; an active mm-wave interconnect, wherein the active mm-wave interconnect has an asymmetrical transceiver architecture, and wherein the active mm-wave interconnect comprises: a dielectric waveguide; a first connector coupled to a first end of the dielectric waveguide, wherein the first connector comprises a first mm-wave engine, and wherein the first connector is electrically coupled to the external predefined interface; a second connector coupled to a second end of the dielectric waveguide, wherein the second connector comprises a second mm-wave engine, and wherein the dielectric wave guide is formed from one or more of liquid crystal polymer (LCP), low-temperature co-fired ceramic (LTCC), glass, polytetrafluoroethylene (PTFE), expanded PTFE, low-density PTFE, ethylene tetrafluoroethylene (ETFE), fluorinated ethylene propylene (FEP), polyether ether ketone (PEEK), or perfluoroalkoxy alkanes (PFA); and a sensor, wherein the sensor comprises: an external predefined interface, wherein the second connector is coupled to the external predefined interface of the sensor, and wherein the sensor is a video camera, a positioning system, an ultrasonic sensor, a radar sensor, or a light detection and ranging (LIDAR) sensor.

Example 25: the vehicle of Example 24, wherein the dielectric waveguide has a length between approximately 1 meter and 15 meters.

What is claimed is:

1. A vehicle, comprising:
    an electronic control unit (ECU), wherein the ECU comprises:
        a printed circuit board (PCB);
        a central processing unit (CPU) die packaged on a CPU packaging substrate, wherein the CPU packaging substrate is electrically coupled to the PCB;
        an external predefined interface electrically coupled to the CPU die;
        a predefined digital interconnect interface die electrically coupled between the CPU die and the external predefined interface; and
        an active millimeter-wave (mm-wave) interconnect, wherein the active mm-wave interconnect comprises:
            a dielectric waveguide, the dielectric waveguide comprising a dielectric material that propagates mm-wave signals;
            a first connector coupled to a first end of the dielectric waveguide, wherein the first connector comprises a first mm-wave engine, and wherein the first connector is electrically coupled to the external predefined interface; and
            a second connector coupled to a second end of the dielectric waveguide, wherein the second connector comprises a second mm-wave engine, and wherein an entirety of the dielectric waveguide is covered with a metallic layer between the first end of the dielectric waveguide and the second end of the dielectric waveguide.

2. The vehicle of claim 1, further comprising:
    a sensor, wherein the sensor comprises an external predefined interface, and wherein the second connector is coupled to the external predefined interface of the sensor.

3. The vehicle of claim 2, wherein the sensor is a video camera, a positioning system, an ultrasonic sensor, a radar sensor, or a light detection and ranging (LIDAR) sensor.

4. The vehicle of claim 1, wherein the first and second mm-wave engines each comprise:
    a power management component; a modulator component and/or a demodulator component; and a mm-wave transmitter component and/or a mm-wave receiver component.

5. The vehicle of claim 4, wherein the first mm-wave engine is packaged on a first mm-wave packaging substrate, and the second mm-wave engine is packaged on a second mm-wave packaging substrate.

6. The vehicle of claim 5, wherein two or more of the components of the first mm-wave engine are fabricated on a single die.

7. The vehicle of claim 4, wherein the first connector and the second connector are predefined interface connectors.

8. The vehicle of claim 7, wherein the predefined interface connectors are small form-factor pluggables (SFP), quad small form-factor pluggables (QSFP), or octal small form-factor pluggables (OSFP).

9. The vehicle of claim 4, wherein the active mm-wave interconnect has an asymmetrical transceiver architecture.

10. The vehicle of claim 1, wherein the dielectric waveguide is between 0.5 meter and 15 meters in length.

11. The vehicle of claim 1, wherein the dielectric waveguide is formed from one or more of liquid crystal polymer (LCP), low-temperature co-fired ceramic (LTCC), glass, polytetrafluoroethylene (PTFE), expanded PTFE, low-density PTFE, ethylene tetrafluoroethylene (ETFE), fluorinated ethylene propylene (FEP), polyether ether ketone (PEEK), or perfluoroalkoxy alkanes (PFA).

12. An electronic control unit (ECU) for a vehicle, comprising:
    a printed circuit board (PCB);
    a central processing unit (CPU) die packaged on a CPU packaging substrate, wherein the CPU packaging substrate is electrically coupled to the PCB;
    a millimeter-wave (mm-wave) engine packaged on a mm-wave engine packaging substrate, wherein the mm-wave engine packaging substrate is coupled to the CPU packaging substrate with a predefined interface;
    a predefined digital interconnect interface die electrically coupled between the CPU die and the mm-wave engine;
    a mm-wave launcher coupled to the mm-wave engine;
    a waveguide connector coupled to the mm-wave launcher; and
    a dielectric waveguide, wherein a first end of the dielectric waveguide is coupled to the waveguide connector and a second end of the dielectric waveguide is coupled to a second waveguide connector.

13. The ECU of claim 12, wherein the second end of the dielectric waveguide is coupled to the second waveguide connector at an edge of an ECU enclosure.

14. The ECU of claim 13, wherein the waveguide connector is coupled to a second dielectric waveguide that extends past the edge of the ECU enclosure.

15. The ECU of claim 14, wherein the waveguide connector comprises a female connector portion, and wherein the second dielectric waveguide is coupled to a male connector portion that is coupled with the female connector portion.

16. The ECU of claim 12, wherein the predefined digital interconnect interface die is packaged on the CPU packaging substrate.

17. The ECU of claim 16, wherein the predefined digital interconnect interface die is packaged on the mm-wave packaging substrate.

18. The ECU of claim 12, wherein the dielectric waveguide is formed from one or more of polytetrafluoroethylene (PTFE), expanded PTFE, low-density PTFE, ethylene tetrafluoroethylene (ETFE), fluorinated ethylene propylene (FEP), polyether ether ketone (PEEK), or perfluoroalkoxy alkanes (PFA).

19. An electronic control unit (ECU) for a vehicle, comprising:
    a printed circuit board (PCB);
    a central processing unit (CPU) die packaged on a CPU packaging substrate, wherein the CPU packaging substrate is electrically coupled to the PCB;
    a millimeter-wave (mm-wave) engine packaged on a mm-wave engine packaging substrate, wherein the mm-wave engine packaging substrate is coupled to the CPU packaging substrate with a predefined interface; and a predefined digital interconnect interface die electrically coupled between the CPU die and the mm-wave engine, wherein the mm-wave engine comprises:

a power management component;

a modulator component and/or a demodulator component; and a mm-wave transmitter component and/or a mm-wave receiver component, wherein a transceiver architecture of the mm-wave engine is an asymmetrical architecture.

20. An electronic control unit (ECU) for a vehicle, comprising:

a printed circuit board (PCB);

a central processing unit (CPU) die packaged on a CPU packaging substrate, wherein the CPU packaging substrate is electrically coupled to the PCB;

a millimeter-wave (mm-wave) engine packaged on a mm-wave engine packaging substrate, wherein the mm-wave engine packaging substrate is coupled to the CPU packaging substrate with a predefined interface;

a mm-wave launcher coupled to the mm-wave engine;

a waveguide connector coupled to the mm-wave launcher; and a dielectric waveguide, wherein a first end of the dielectric waveguide is coupled to the waveguide connector, wherein a second end of the dielectric waveguide is coupled to a second waveguide connector at an edge of an ECU enclosure, wherein the waveguide connector is coupled to a second dielectric waveguide that extends past the edge of the ECU enclosure, and wherein the waveguide connector comprises a female connector portion, and wherein the second dielectric waveguide is coupled to a male connector portion that is coupled with the female connector portion.

* * * * *